US008987856B2

(12) United States Patent
Shu et al.

(10) Patent No.: US 8,987,856 B2
(45) Date of Patent: Mar. 24, 2015

(54) PHOTODIODE HAVING N-TYPE AND INTRINSIC AMORPHOUS IGZO LAYERS

(75) Inventors: Fang-An Shu, Hsinchu (TW); Yao-Chou Tsai, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 105 days.

(21) Appl. No.: 13/433,298

(22) Filed: Mar. 29, 2012

(65) Prior Publication Data

US 2012/0261656 A1  Oct. 18, 2012

(30) Foreign Application Priority Data

Apr. 15, 2011 (TW) .............................. 100113215 A
Feb. 16, 2012 (TW) .............................. 101105122 A

(51) Int. Cl.
*H01L 31/105* (2006.01)
*G01J 1/42* (2006.01)
*H01L 31/032* (2006.01)
*H01L 31/0224* (2006.01)
*H01L 31/108* (2006.01)

(52) U.S. Cl.
CPC ................ *G01J 1/42* (2013.01); *H01L 31/032* (2013.01); *H01L 31/105* (2013.01); *H01L 31/022483* (2013.01); *H01L 31/108* (2013.01)
USPC ...... 257/458; 257/43; 257/233; 257/E31.061; 257/E31.093; 257/E31.044; 438/85; 438/93; 438/96

(58) Field of Classification Search
CPC ... H01L 31/105; H01L 31/032; H01L 31/108; H01L 31/022483; G01J 1/42

USPC ................. 257/43, 292, 233, 258, E31.061, 257/E31.093, E31.004; 438/85, 93, 96
See application file for complete search history.

(56) References Cited

U.S. PATENT DOCUMENTS

| 2005/0205294 | A1* | 9/2005 | Yamashita et al. ............ 174/255 |
| 2006/0060933 | A1* | 3/2006 | Gao et al. ..................... 257/458 |
| 2006/0108529 | A1* | 5/2006 | Saito et al. ................. 250/338.4 |
| 2009/0026509 | A1* | 1/2009 | Hayashi et al. .............. 257/292 |
| 2009/0189153 | A1* | 7/2009 | Iwasaki et al. .................. 257/43 |
| 2010/0289103 | A1* | 11/2010 | Yamamoto et al. ............ 257/458 |
| 2011/0024739 | A1* | 2/2011 | Shu et al. ....................... 257/43 |
| 2011/0204371 | A1* | 8/2011 | Kozuma et al. ................. 257/59 |
| 2012/0205649 | A1* | 8/2012 | Hattori et al. .................... 257/43 |

FOREIGN PATENT DOCUMENTS

| CN | 101976672 A | 2/2011 |
| CN | 101997010 A | 3/2011 |
| WO | WO/2007/069634 | * 6/2007 |

* cited by examiner

*Primary Examiner* — Fernando Toledo
*Assistant Examiner* — Peter Bradford
(74) *Attorney, Agent, or Firm* — CKC & Partners Co., Ltd.

(57) ABSTRACT

A photodiode, a light sensor and a fabricating method thereof are disclosed. An n-type semiconductor layer and an intrinsic semiconductor layer of the photodiode respectively comprise n-type amorphous indium gallium zinc oxide (IGZO) and intrinsic IGZO. The oxygen content of the intrinsic amorphous IGZO is greater than the oxygen content of the n-type amorphous IGZO. A light sensor comprise the photodiode is also disclosed.

9 Claims, 3 Drawing Sheets

PHOTODIODE HAVING N-TYPE AND INTRINSIC AMORPHOUS IGZO LAYERS

CROSS-REFERENCE TO RELATED APPLICATION

This application claims the priority benefit of Taiwan application serial no. 100113215, filed Apr. 15, 2011, and the priority benefit of Taiwan application serial no. 101105122, filed Feb. 16, 2012 as well, the full disclosure of which is incorporated herein by reference.

BACKGROUND

1. Technical Field

The disclosure relates to a photoelectric conversion device. More particularly, the present disclosure relates to a light sensor comprising a photodiode.

2. Description of Related Art

Conventional light sensors mostly comprise photodiodes made of amorphous silicon (α-Si) in combination with thin-film transistors (TFTs). Since amorphous silicon has photoelectric characteristics, amorphous silicon has been utilized in light sensor devices.

Amorphous silicon is usually doped with 3A group and 5A group materials to form a PIN (p-intrinsic-n) type photodiode. However, since both ultraviolet and visible light may introduce photoelectric effects in the conventional photodiode, it is difficult to distinguish the electric signals caused by ultraviolet (UV) light from the electric signals caused by visible light. Therefore, the conventional light sensors have limited applications.

SUMMARY

Accordingly, an aspect of this invention is to provide a photodiode.

According to an embodiment of this invention, the photodiode comprises a lower electrode, N-type semiconductor layer, intrinsic semiconductor, and an upper electrode sequentially on a substrate. The N-type semiconductor layer comprises a N-type amorphous indium gallium zinc oxide (IGZO) layer, and the intrinsic semiconductor layer comprises an intrinsic amorphous indium gallium zinc oxide (IGZO) layer. The oxygen content of the intrinsic amorphous IGZO is greater than the oxygen content of the N type amorphous IGZO. According to another embodiment of this invention, the photodiode further comprises a P-type semiconductor layer disposed between the intrinsic semiconductor layer and the upper electrode. The material of the P-type semiconductor layer is aluminum nitride zinc oxide (AlNZnO$_x$), aluminum zinc oxide (AlZnO$_x$), lithium zinc oxide (LiZnO$_x$), arsenic zinc oxide (AsZnO$_x$), or antimony zinc oxide (SbZnO$_x$).

Another aspect of this invention is to provide a light sensor.

According to an embodiment of this invention, the light sensor comprises a thin film transistor (TFT) and a photodiode. The TFT comprises a gate, a gate dielectric layer, and a channel layer sequentially on a substrate. The TFT further comprises a source and a drain respectively disposed on two opposite ends of the channel layer. The photodiode is disposed on the drain. The photodiode comprises a N-type semiconductor layer, an intrinsic semiconductor, and an upper electrode sequentially on the drain of the TFT. The N-type semiconductor layer comprises a N-type amorphous indium gallium zinc oxide (IGZO) layer, and the intrinsic semiconductor layer comprises an intrinsic amorphous indium gallium zinc oxide (IGZO) layer. The oxygen content of the intrinsic amorphous IGZO is greater than the oxygen content of the N type amorphous IGZO.

According to another embodiment of this invention, the photodiode further comprises a P-type semiconductor layer disposed between the intrinsic semiconductor layer and the upper electrode. The material of the P-type semiconductor layer is aluminum nitride zinc oxide (AlNZnO$_x$), aluminum zinc oxide (AlZnO$_x$), lithium zinc oxide (LiZnO$_x$), arsenic zinc oxide (AsZnO$_x$), or antimony zinc oxide (SbZnO$_x$).

In yet another aspect of this invention, a fabricating method of the photodiode above is provided. This fabricating method comprises the following steps. A sputtering target made by a mixture comprising indium oxide, gallium oxide, and zinc oxide is provided. Then, a sputtering process under an atmosphere containing oxygen and argon is performed to continuously form the N-type semiconductor layer and the intrinsic semiconductor layer. In this sputtering step, the flow rate ratio of the oxygen to the argon for depositing the N-type semiconductor layer is smaller than the flow rate ratio of the oxygen to the argon for depositing the intrinsic semiconductor layer.

According to an embodiment of this invention, the flow rate ratio of the oxygen to the argon for depositing the N-type semiconductor layer is 0-0.15.

According to another of this invention, the flow rate ratio of the oxygen to the argon for depositing the intrinsic semiconductor layer is 0.02-0.7.

The foregoing presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

Many of the attendant features will be more readily appreciated as the same becomes better understood by, reference to the following detailed description considered in connection with the accompanying drawings.

DETAILED DESCRIPTION

Figure 1:
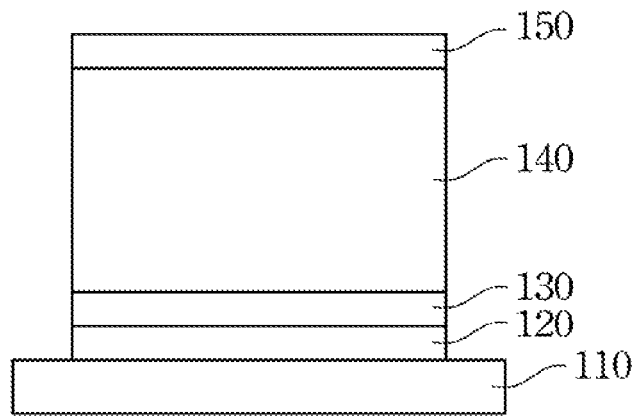
FIG. 1 is a cross-sectional view schematically illustrating a Schottky-type photodiode according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Photodiodes

FIG. 1 is a cross-sectional view schematically illustrating a Schottky-type photodiode according to one embodiment of the present disclosure. In FIG. 1, the Schottky-type photodiode 100 comprises a substrate 110, a lower electrode 120, a N-type semiconductor layer 130, an intrinsic semiconductor layer 140, and an upper electrode 150.

The substrate 110 can be made from a transparent or opaque material. According to an embodiment, the transparent material can be glass or quartz. According to another embodiment, the opaque material can be a heat-resistant plastic.

The lower electrode 120 can be made from a conductive material, such as a metal or doped polysilicon.

The N-type semiconductor layer 130 may be made from N-type amorphous indium gallium zinc oxide (IGZO). According to an embodiment, the thickness of the N-type semiconductor layer 130 may be 300-5000 Å.

The intrinsic semiconductor layer 140 may be made from intrinsic amorphous indium gallium zinc oxide (IGZO). The oxygen content of the intrinsic amorphous IGZO is greater than the oxygen content of the N-type amorphous IGZO. In general, the thickness of the intrinsic semiconductor layer 140 is greater than the thickness of the N-type semiconductor layer 130. For example, the thickness of the intrinsic semiconductor layer 140 is 1-5 µm.

The upper electrode 150 can be made from a transparent conductive material, such as indium tin oxide ($InSnO_x$), or antimony tin oxide ($SbSnO_x$).

Figure 2:
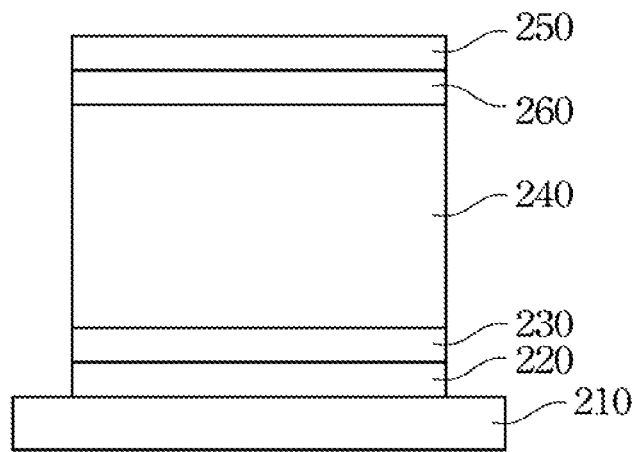
FIG. 2 is a cross-sectional view schematically illustrating a NIP-type photodiode according to another embodiment of the present disclosure.

FIG. 2 is a cross-sectional view schematically illustrating a NIP-type photodiode according to another embodiment of the present disclosure. In FIG. 2, the NIP-type photodiode 200 comprises a substrate 210, a lower electrode 220, a N-type semiconductor layer 230, an intrinsic semiconductor layer 240, a P-type semiconductor layer 260, and an upper electrode 250.

In the NIP-type photodiode 200, the substrate 210, the lower electrode 220, the N-type semiconductor layer 230, the intrinsic semiconductor layer 240, and the upper electrode 250 are similar to or the same as the substrate 110, the is lower electrode 120, the N-type semiconductor layer 130, the intrinsic semiconductor layer 140, and the upper electrode 150 in FIG. 1. Hence, a detailed description about these elements is omitted here. In the NIP-type photodiode 200, the P-type semiconductor layer 260 is further provided to be disposed between the intrinsic semiconductor layer 240 and the upper electrode 250.

The P-type semiconductor layer 260 can be made from aluminum nitride zinc oxide ($AlNZnO_x$), aluminum zinc oxide ($AlZnO_x$), lithium zinc oxide ($LiZnO_x$), arsenic zinc oxide ($AsZnO_x$), or antimony zinc oxide ($SbZnO_x$), for example. In one embodiment, the thickness of the P-type semiconductor layer 260 is substantially the same as that of the N-type semiconductor layer 230. In particular, the P-type semiconductor layer 260 is 300-5000 Å in thickness.

Light Sensor

Figure 3A:
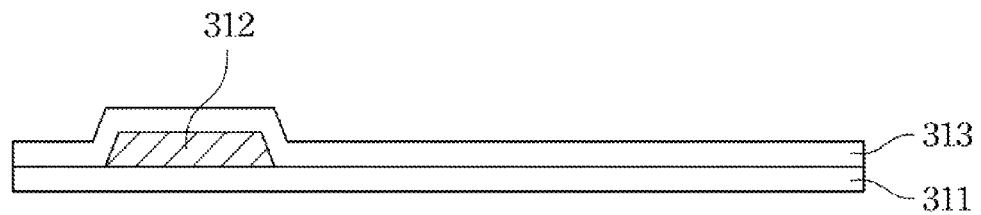
FIGS. 3A-3E are cross-sectional views schematically illustrating process steps for manufacturing a light sensor according to one embodiment of the present disclosure.
Figure 3B:
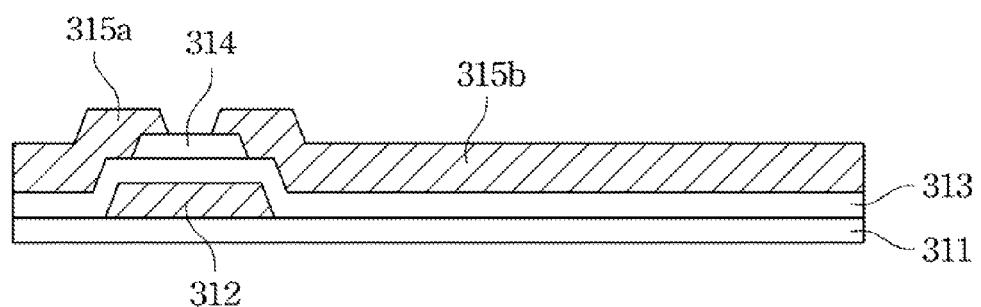
Figure 3C:
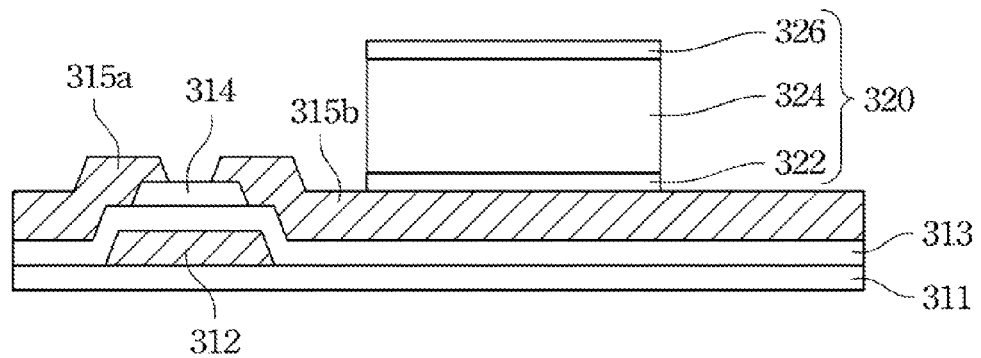
Figure 3D:
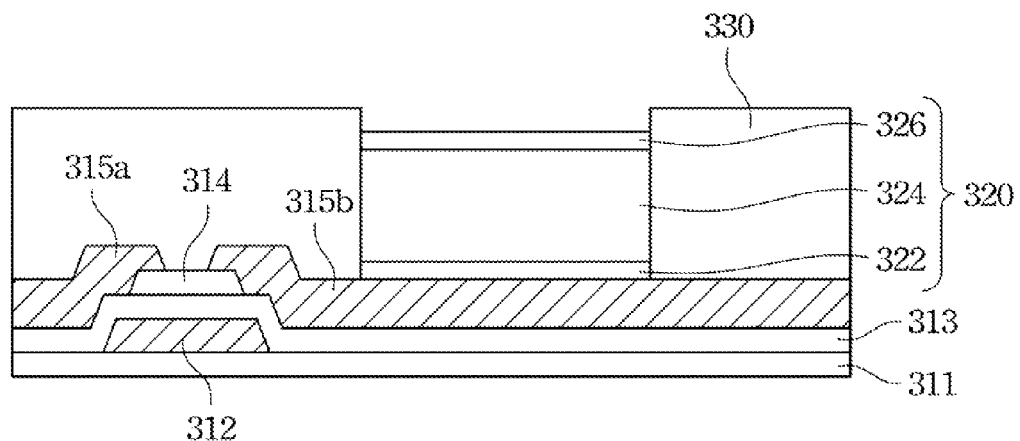
Figure 3E:
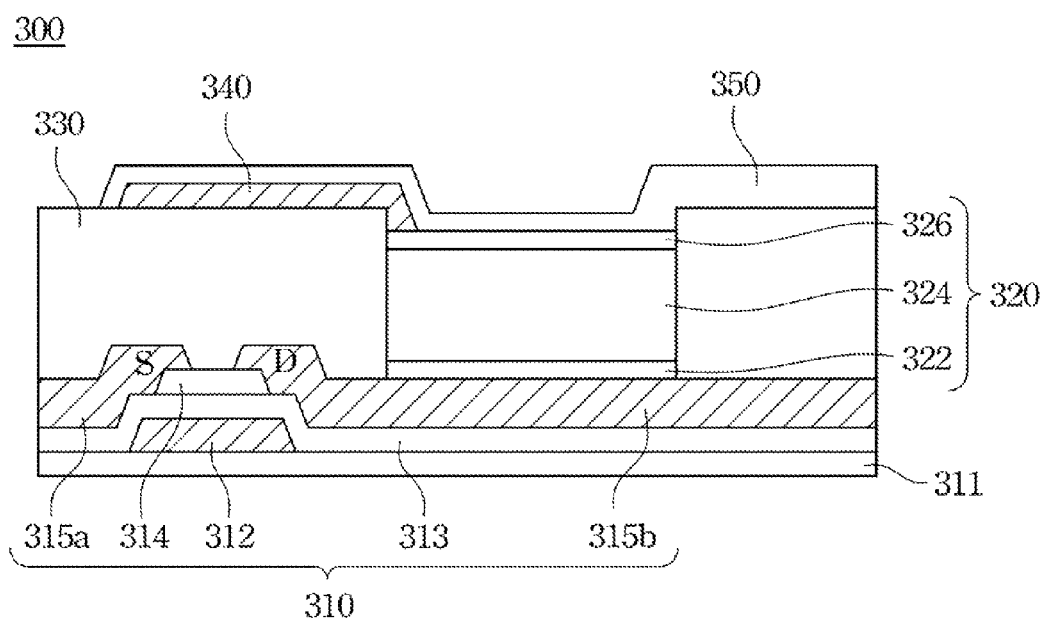

FIG. 3E is a cross-sectional view schematically illustrating a light sensor 300 according to one embodiment of the present disclosure. The light sensor 300 comprises a thin film transistor (TFT) 310 and a photodiode 320 on a substrate 311.

The TFT 310 comprises a gate 312, a gate dielectric layer 313, and a channel layer 314, a source 315a, and a drain 315b. The thin-film transistor 310 is described in detail hereinafter. The gate electrode 312 is disposed on the substrate 310. The gate dielectric layer 313 overlays the gate electrode 312 and the substrate 311. The channel layer 314 is disposed on the gate dielectric layer 313. In particular, the channel layer 314 is disposed on the gate dielectric layer 313 at a position directly above the gate electrode 312. The source 315a and the drain 315b are disposed on two opposite ends of the channel layer 314. Furthermore, the photodiode 320 is disposed on the drain 315b of the TFT 310.

In practice, the substrate 311 can be made from a transparent material or an opaque material for various applications. According to an embodiment, the transparent material may be glass or quartz. According to another embodiment, the opaque material may be a heat-resistant plastic.

The gate 312 can be made of a conductive material, such as metal, alloy, metal silicide, metal nitride, or doped polysilicon. The metal above can be Mo, Cr, Cu, or Al, for example. The alloy can be MoCr alloy, or AlNd alloy, for example. The metal silicide can be titanium silicide, cobalt silicide, nickel silicide, tantalum silicide, for example. The metal nitride can be titanium nitride, or tantalum nitride, for example.

The gate dielectric layer 313 is usually made from a dielectric material having a high dielectric constant. In one embodiment, the gate dielectric layer 313 may be made from silicon oxide, silicon oxynitride, or silicon nitride, for example.

The channel layer 314 can be made from amorphous silicon, hydrogenated amorphous silicon, or intrinsic amorphous IGZO. Optionally, the channel layer 314 can be lightly doped by various dopants for various applications. For example, an N-type dopant may be used to dope the channel layer 314. In one embodiment, the channel layer 314 comprises the intrinsic amorphous IGZO.

The source 315a and the drain 315b can be made from a conductive material, such as metal, alloy, metal silicide, metal nitride, or doped polysilicon. The metal above can be Mo, Cr, Cu, or Al, for example. The alloy can be MoCr alloy, or AlNd alloy, for example. The metal silicide can be titanium silicide, cobalt silicide, nickel silicide, tantalum silicide, for example. The metal nitride can be titanium nitride, or tantalum nitride, for example. The dopant's concentration of the source 315a and the drain 315b is usually higher than the dopant's concentration of the channel layer 314.

When the photodiode 320 is a Schottky-type photodiode, it comprises a lower electrode extending from the drain 315b, an N-type semiconductor layer 322, an intrinsic semiconductor layer 324 and an upper electrode 350. When the photodiode 320 is an NIP-type photodiode, it further comprises a P-type semiconductor layer 326. The portion of the drain 315b positioning under the N-type semiconductor layer 322 is also used as the lower electrode of the photodiode 320.

The photodiode 320 is described in detail hereinafter. When the photodiode 320 is a Schottky-type photodiode 100 in FIG. 1, the N-type semiconductor layer 322, the intrinsic semiconductor layer 324 and the upper electrode 350 are sequentially disposed on the drain 315b. When the photodiode 320 is an NIP-type photodiode in FIG. 2, the P-type semiconductor layer 326 is further disposed between the intrinsic semiconductor layer 324 and the upper electrode 350.

The materials used in N-type semiconductor layer 322, the intrinsic semiconductor layer 324, the P-type semiconductor layer 326 and the upper electrode 350 have been described in the related descriptions of FIGS. 1 and 2, and hence are omitted here.

In some embodiments, the light sensor 300 can further comprises a protection layer 330 and a conductive layer 340 for various applications.

The protection layer 330 covers the TFT 310 to protect the TFT 310, but exposes the photodiode 320. The protection layer 330 is usually made from a dielectric layer, such as silicon oxide, silicon nitride, amorphous carbon or diamond-like carbon (DLC). As it may be appreciated by those with ordinary skill in the art, the protection layer 330 may be made of various materials by several methods, and may have different structures. For example, the protection layer 330 may have a structure having two layers.

The conductive layer is an opaque metal layer. The conductive layer 340 may shade the thin-film transistor 310 from light, and thereby prevent the thin-film transistor 310 from generating a photocurrent. Furthermore, the conductive layer 340 and the upper electrode 350 are collectively used to reduce an overall resistance and to decrease a voltage drop. The conductive layer 340 may be made of metal or alloy. The metal may be molybdenum (Mo), chromium (Cr), aluminum (Al), or copper (Cu), for example. The alloy may be molybdenum-chromium alloy (MoCr), aluminum-neodymium alloy (AlNd).

Method of Fabricating Light Sensor

FIGS. 3A-3E are cross-sectional views schematically illustrating process steps for manufacturing a light sensor according to one embodiment of the present disclosure. In FIG. 3A, the gate electrode 312 and the gate dielectric layer 313 are sequentially formed on the substrate 311. The gate may be formed by deposition, lithography, and etching processes, sequentially. The material of the gate 312 can be a conductive material, such as metal, alloy, metal silicide, metal nitride, or doped amorphous silicon. Therefore, the deposition method can be varied for various materials. For example, the gate 312 may be made of doped polysilicon, which is formed by chemical vapor deposition.

The gate dielectric layer 313 can be made of silicon oxide, silicon oxynitride, or silicon nitride. The formation method of the gate dielectric layer 313 can be chemical vapor deposition, for example.

In FIG. 3B, the channel 314 is formed on the gate dielectric layer 313. Particularly, the channel layer 314 is formed at a position directly above the gate 312. The source 315a and the drain 315b are formed on the two opposite ends of the channel layer 314 on the gate dielectric layer 313. The channel layer 314, the source 315a and the drain 315b can be respectively formed by deposition, photolithography, and etching processes.

Since the channel layer 314 can be made from amorphous silicon, hydrogenated amorphous silicon, or intrinsic IGZO, and the source 315a and the drain 315b can be made from metal, alloy, metal silicide, metal nitride, or doped polysilicon, the deposition method for depositing the channel layer 314, the source 315a, and the drain 315b can be varied for various materials. For example, the material of amorphous silicon, hydrogenated amorphous silicon, and doped polysilicon can be deposited by chemical vapor deposition, for example. The material of intrinsic IGZO can be deposited by sputtering, for example.

In FIG. 3C, the photodiode 320 is formed on a part of the drain 315b. When the photodiode 320 is a Schottky-type photodiode, the fabricating method is described below. The N-type semiconductor layer 322 and the intrinsic semiconductor layer 324 are sequentially formed on the drain 315b, and then patterned by photolithography and etching to obtain the photodiode 320. When the photodiode 320 is an NIP-type photodiode, the N-type semiconductor layer 322, the intrinsic semiconductor layer 324 and the P-type semiconductor layer 326 are sequentially formed on the drain 315b, and then patterned by photolithography and etching to obtain the photodiode 320.

According to an embodiment, the material of both the N-type semiconductor layer 322 and the intrinsic semiconductor layer 324 comprise amorphous IGZO, and the difference between the material of the N-type semiconductor layer 322 and the intrinsic semiconductor layer 324 is only oxygen content. Therefore, the N-type semiconductor layer 322 and the intrinsic semiconductor layer 324 can be continuously formed by a single sputtering process, and the oxygen content of the amorphous IGZO can be determined by controlling the flow rate ratio of oxygen to argon during the single sputtering process. In the sputtering process for forming the N-type semiconductor layer 322, the flow rate ratio of the oxygen to argon is about 0-0.15. In the sputtering process for forming the intrinsic semiconductor layer 322, the flow rate ratio of the oxygen to argon is about 0.02-0.7.

According to another embodiment, the N-type semiconductor layer 322 and the intrinsic semiconductor layer 324 can be continuously formed by another method. In this method, an N-type amorphous IGZO is formed by sputtering to have a thickness equal to the total thickness of the N-type semiconductor layer 322 and the intrinsic semiconductor layer 324. Then, a plasma containing oxygen can be used to post treat the N-type amorphous IGZO to increase the oxygen content of the upper portion of the N-type amorphous IGZO. Thus, the upper portion of the N-type amorphous IGZO can become intrinsic amorphous IGZO to compose the intrinsic semiconductor layer 324. The untreated lower portion of the N-type amorphous IGZO can compose the N-type semiconductor layer 322.

The target used in the sputtering process for depositing the amorphous IGZO is made from a mixture containing indium oxide, gallium oxide, and zinc oxide.

Since the material of the P-type semiconductor 326 is mostly doped zinc oxide, the forming method can be sputtering.

In FIG. 3D, the protection layer 330 is formed on the source 315a and the drain 315b, and the portion of the protection layer 330 on the photodiode 320 is then removed to expose the photodiode 320. The protection layer 330 can be formed by deposition, such as chemical vapor deposition. The removal method of the protection layer 330 can be photolithography and etching processes.

In FIG. 3E, the conductive layer 340 and the upper electrode 350 are sequentially formed on a portion of the protection layer 330. The conductive layer 340 and the upper electrode 350 can be formed by deposition, photolithography, and etching processes.

Since the material of the conductive layer 340 is metal or alloy, the deposition method of the conductive layer 340 can be physical vapor deposition. The material of the upper electrode 350 is transparent conductive material. When the upper electrode 350 is made from indium tin oxide ($InSnO_x$) or antimony tin oxide ($SbSnO_x$), the deposition method can be physical vapor deposition.

The photodiode disclosed herein comprises amorphous indium gallium zinc oxide having photoelectric properties. The charge carrier mobility of the amorphous indium gallium zinc oxide is greater than that of conventional hydrogenated amorphous silicon (a-Si:H). Furthermore, the amorphous indium gallium zinc oxide only absorbs UV light, whereas visible light is not absorbed and transmitted through the amorphous indium gallium zinc oxides. Hence, the problem of distinguishing the electric signals introduced by UV light from the electric signals introduced by visible light in the prior art may be resolved. Therefore, the photodiode of the present disclosure can be widely applied in UV light sensors, UV light switches, solar panels, smart windows, etc.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A photodiode, comprising:
   a substrate;
   a lower electrode disposed on the substrate;
   a N-type semiconductor layer disposed on the lower electrode, wherein the N-type semiconductor layer comprises a N-type amorphous indium gallium zinc oxide (IGZO) layer;
   an intrinsic semiconductor layer disposed on the N-type semiconductor layer, wherein the intrinsic semiconductor layer comprises an intrinsic amorphous indium gallium zinc oxide (IGZO) layer, and the oxygen content of the intrinsic amorphous IGZO layer is higher than the oxygen content of the N-type amorphous IGZO layer; and
   an upper electrode disposed on the intrinsic semiconductor layer.

2. The photodiode of claim 1, further comprising a P-type semiconductor layer disposed between the intrinsic semiconductor layer and the upper electrode, wherein a material of the P-type semiconductor layer is aluminum nitride zinc oxide ($AlNZnO_x$), aluminum zinc oxide ($AlZnO_x$), lithium zinc oxide ($LiZnO_x$), arsenic zinc oxide ($AsZnO_x$), or antimony zinc oxide ($SbZnO_x$).

3. The photodiode of claim 2, wherein a thickness of the P-type semiconductor layer is about 300-5000 Å.

4. The photodiode of claim 1, wherein a thickness of the N-type semiconductor layer is about 300-5000 Å.

5. The photodiode of claim 1, wherein a thickness of the intrinsic semiconductor layer is about 1-5 μm.

6. A light sensor, comprising:
   a thin film transistor (TFT) on a substrate, wherein the TFT comprises:
      a gate on the substrate;
      a gate dielectric layer covering the gate and the substrate:
      a channel layer disposed on the gate dielectric layer and right above the gate; and
      a source and a drain respectively disposed on two opposite ends of the channel layer; and
   a photodiode disposed on the drain, wherein the photodiode comprises:
      a N-type semiconductor layer disposed on the drain, wherein the N-type semiconductor layer comprises a N-type amorphous indium gallium zinc oxide (IGZO);
      an intrinsic semiconductor layer disposed on the N-type semiconductor layer, wherein the intrinsic semiconductor layer comprises an intrinsic amorphous indium gallium zinc oxide (IGZO) and the oxygen content of the intrinsic amorphous IGZO is greater than the oxygen content of the N-type amorphous IGZO; and
      an upper electrode disposed on the intrinsic, semiconductor layer.

7. The light sensor of claim h, wherein the photodiode further comprises a P-type semiconductor layer disposed between the intrinsic semiconductor layer and the upper electrode.

8. The light sensor of claim 7, wherein a material of the P-type semiconductor layer is aluminum nitride zinc oxide ($AlNZnO_x$), aluminum zinc oxide ($AlZnO_x$), lithium zinc oxide ($LiZnO_x$), arsenic zinc oxide ($AsZnO_x$), or antimony zinc oxide ($SbZnO_x$).

9. The light sensor of claim 6, further comprising:
   a protection layer covering the source, the drain, and the channel, but exposing the photodiode; and
   a conductive layer disposed on the protection layer and connecting the upper electrode of the photodiode.